United States Patent
Ishimaru et al.

(10) Patent No.: US 10,229,838 B2
(45) Date of Patent: Mar. 12, 2019

(54) PLASMA ETCHING METHOD

(71) Applicant: HITACHI HIGH-TECHNOLOGIES CORPORATION, Minato-ku, Tokyo (JP)

(72) Inventors: Ryo Ishimaru, Tokyo (JP); Satoshi Une, Tokyo (JP); Masahito Mori, Tokyo (JP)

(73) Assignee: HITACH HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/701,692

(22) Filed: Sep. 12, 2017

(65) Prior Publication Data

US 2018/0122651 A1    May 3, 2018

(30) Foreign Application Priority Data

Oct. 31, 2016    (JP) .................... 2016-212459

(51) Int. Cl.
| | |
|---|---|
| *H01L 21/302* | (2006.01) |
| *H01L 21/3213* | (2006.01) |
| *H01L 21/306* | (2006.01) |
| *H01L 21/311* | (2006.01) |
| *H01L 21/28* | (2006.01) |

(52) U.S. Cl.
CPC .. *H01L 21/32136* (2013.01); *H01L 21/28079* (2013.01); *H01L 21/28273* (2013.01); *H01L 21/30621* (2013.01); *H01L 21/31116* (2013.01)

(58) Field of Classification Search
CPC ......... H01L 21/28079; H01L 21/28273; H01L 21/31116; H01L 21/30621

USPC ................. 438/711, 720, 721, 742
See application file for complete search history.

(56) References Cited

U.S. PATENT DOCUMENTS

| | | | | |
|---|---|---|---|---|
| 4,793,897 | A | * | 12/1988 | Dunfield ................ C23F 4/00 204/192.37 |
| 2007/0281477 | A1 | | 12/2007 | Lee et al. |
| 2010/0140688 | A1 | * | 6/2010 | Fujimoto ........ H01L 21/823437 257/329 |
| 2011/0151670 | A1 | * | 6/2011 | Lee ................. H01L 21/32136 438/695 |
| 2014/0120727 | A1 | | 5/2014 | Subramanian et al. |
| 2016/0314981 | A1 | | 10/2016 | Yoon et al. |

FOREIGN PATENT DOCUMENTS

JP          2008-21975 A     1/2008

OTHER PUBLICATIONS

Office Action dated Mar. 27, 2018 for Taiwanese Application No. 106127962.

* cited by examiner

*Primary Examiner* — Binh X Tran
(74) *Attorney, Agent, or Firm* — Miles & Stockbridge P.C.

(57) ABSTRACT

A plasma etching method for etching a film containing a tungsten element using plasma, wherein the film containing a tungsten element is etched by using a gas containing a silicon element, a gas containing a halogen element, and a gas containing a carbon element and an oxygen element.

6 Claims, 7 Drawing Sheets

PLASMA ETCHING METHOD

BACKGROUND OF THE INVENTION

1. Field of the Invention

The present invention relates to an etching method using plasma for semiconductor manufacturing and display manufacturing.

2. Description of the Related Art

Along with higher speed and higher integration of semiconductor devices, reductions in cell sizes of Logic and DRAM or the like, and reductions in widths and thicknesses of gate electrodes and capacitor film electrodes of transistors have proceed. One technique for achieving the higher speed of the semiconductor device is a polymetal gate structure composed of a laminate of tungsten (W), tungsten nitride (WN), and poly-Si from a poly-Si single layer as a gate electrode material.

As a method of etching a tungsten (W)-containing film constituting the polymetal gate, for example, JP-2008-021975-A discloses a method including a first step of supplying a first gas mixture which contains an etching gas containing chlorine and fluorine and an oxidizing gas containing oxygen gas and nitrogen gas to a chamber; a step of biasing the electrode at RF power of a first level; and a step of applying RF power of second level to excite the first gas mixture to plasma, thereby etching at least the tungsten-containing layer so that at least a part of a silicon layer is exposed, wherein a ratio of the second level to the first level is 4 to 8.

SUMMARY OF THE INVENTION

When a gate electrode miniaturized by the method disclosed in JP-2008-021975-A is etched, the width of SiN which is a hard mask is reduced with a F-based gas to reduce a processing dimension, or an insufficient mask selection ratio may cause the shoulder lack of the gate electrode, the disconnection of the pattern, or the variation in a processing dimension to cause a decrease in a yield.

In order to solve the above problems, an object of the present invention is to provide a plasma etching method for etching a film containing a tungsten element using a miniaturized pattern, wherein the film containing a tungsten element can be etched with a high selection ratio and a high throughput with respect to a SiN film.

The present invention provides a plasma etching method for etching a film containing a tungsten element using plasma, wherein the film containing a tungsten element is etched by using a gas containing a silicon element, a gas containing a halogen element, and a gas containing a carbon element and an oxygen element.

The present invention also provides a plasma etching method for etching a film containing a tungsten element using plasma, wherein the film containing a tungsten element is etched by using a mixed gas of $Cl_2$ gas, $SiCl_4$ gas, oxygen gas, and CO gas, a mixed gas of $Cl_2$ gas, $SiCl_4$ gas, oxygen gas, and $CO_2$ gas, or a mixed gas of $Cl_2$ gas, $SiCl_4$ gas, oxygen gas, and COS gas.

According to the present invention, a film containing a tungsten element can be etched with a high selection ratio and a high throughput with respect to a SiN film in a plasma etching method for etching a film containing a tungsten element using a miniaturized pattern.

DESCRIPTION OF THE PREFERRED EMBODIMENTS

Figure 1:
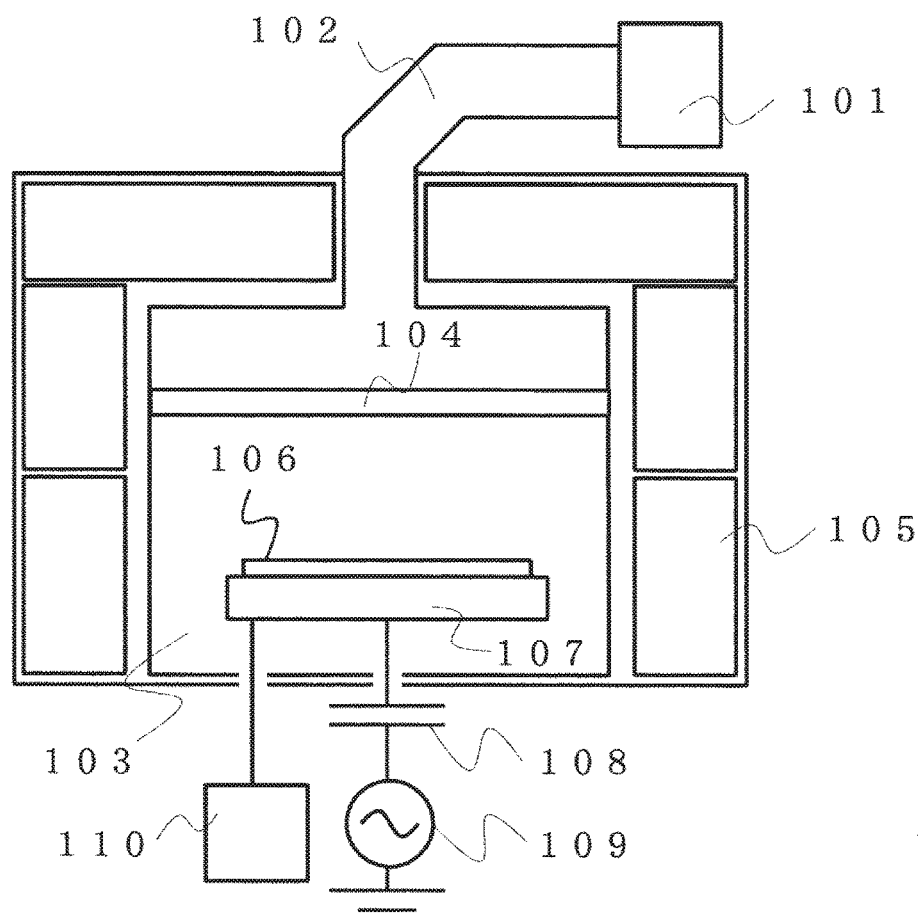
FIG. 1 is a schematic cross-sectional view of a plasma etching apparatus used in one Example of the present invention.

FIG. 1 is a schematic sectional view of a plasma etching apparatus used for carrying out the present Example. This plasma etching apparatus is an Electron Cyclotron Resonance (hereinafter, referred to as ECR) type plasma etching apparatus.

A microwave oscillated by a magnetron 101 is made incident on a processing chamber 103 via a waveguide 102 and a quartz plate 104. An etching gas is supplied from above into the processing chamber 103, and a gas pressure during an etching treatment is maintained constant by a pressure regulating valve (not shown) set between the processing chamber 103 and a vacuum pump (not shown) disposed below the processing chamber 103. The gas whose pressure has been thus adjusted is efficiently converted into plasma by the interaction between a magnetic field formed in the processing chamber 103 by a solenoid coil 105 and the microwave.

A sample stage 107 on which a wafer 106 as a sample is placed is disposed in the processing chamber 103 and connected to a radio frequency power supply 109 which oscillates a radio frequency of 400 kHz via a blocking capacitor 108. By changing continuous or time-modulated radio frequency power (wafer bias power) supplied to the sample stage 107 by the radio frequency power supply 109, the energy of ions to be drawn into the wafer 106 from the plasma is controlled. Temperature control means 110 connected to the sample stage 107 controls the surface temperature of the wafer 106 during an etching treatment with good reproducibility. In the present Example, the set temperature of the temperature control means 110 is set at 60° C. Next, a plasma etching method of the present Example using the ECR type plasma etching apparatus will be described.

Figure 2A:
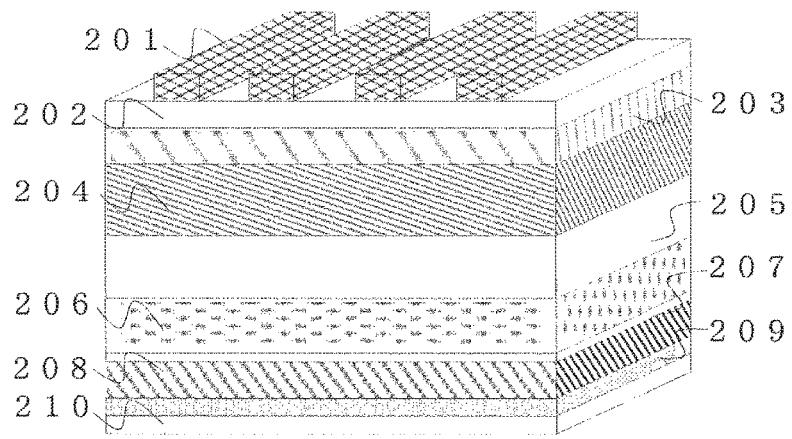
FIG. 2A is a perspective view of a wafer having a polymetal gate structure used in one Example of the present invention.

FIG. 2A is a perspective view of a wafer having a polymetal gate structure used in the present Example. A gate insulating film 209, a polysilicon film 208, a tungsten nitride film (WN) 207, a tungsten film (W) 206, a silicon nitride film (SiN) 205, an organic film 204, a silicon nitride oxide film (SiON) 203, an anti-reflection film (BARC) 202, and an ArF resist film 201 with a patterned gate wire are sequentially disposed from the bottom on a silicon substrate 210.

Figure 2B:
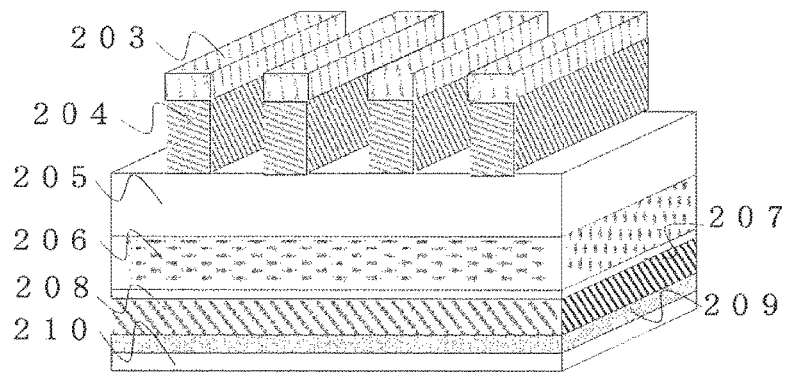
FIG. 2B is a perspective view of a wafer of FIG. 2A, which anti-reflection film, silicon nitride oxide (SiON) film, organic film are etched.
Figure 2C:
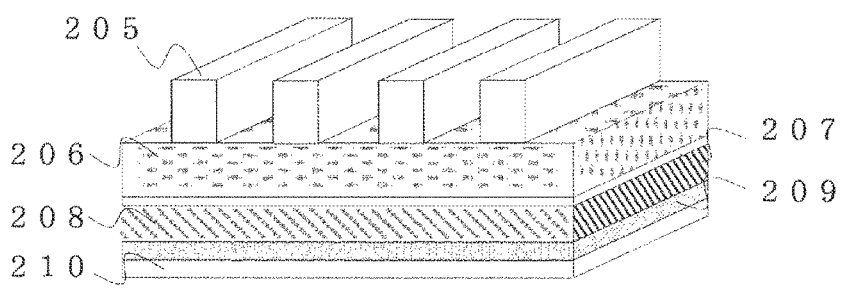
FIG. 2C is a perspective view of a wafer of FIG. 2A, which etched silicon nitride (SiN) film remains as a mask for a gate electrode of the polymetal gate structure.

First, as shown in FIG. 2B, the anti-reflection film 202, the silicon nitride oxide film (SiON) 203, the organic film 204, and the silicon nitride film 205 are etched, and the organic film 204 is then removed by $O_2$ plasma in the same processing chamber, which provides a state before a gate electrode having a lower polymetal gate structure with the silicon nitride film 205 as a mask is etched as shown in FIG. 2C. Here, the gate electrode having a polymetal gate structure is a laminated film of a tungsten film (W) 206, a tungsten nitride film (WN) 207, and a polysilicon film 208.

Figure 3:
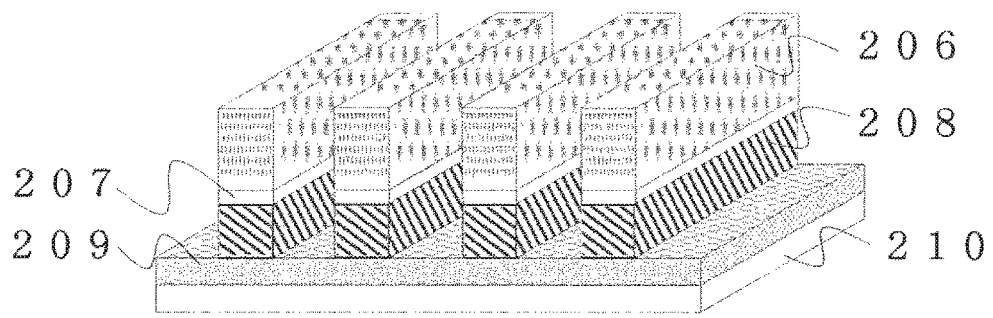
FIG. 3 shows the result of forming a gate electrode of the polymetal gate structure shown in FIG. 2A by a plasma etching method of the present invention.

Next, as a result of etching the tungsten film (W) 206 using a mixed gas of $Cl_2$ gas, $SiCl_4$ gas, and $O_2$ gas, etching the tungsten nitride film (WN) 207 using a mixed gas of $Cl_2$ gas, $SiCl_4$ gas, $O_2$ gas and COS gas, and etching the polysilicon film 208 using a mixed gas of $Cl_2$ gas, $O_2$ gas, and HBr gas, in the gate electrode having a polymetal gate structure as shown in FIG. 2C, as shown in FIG. 3, it is possible to achieve the formation of a gate electrode having a polymetal gate structure having no pattern disconnection and no variation in a processing dimension.

Figure 4A:
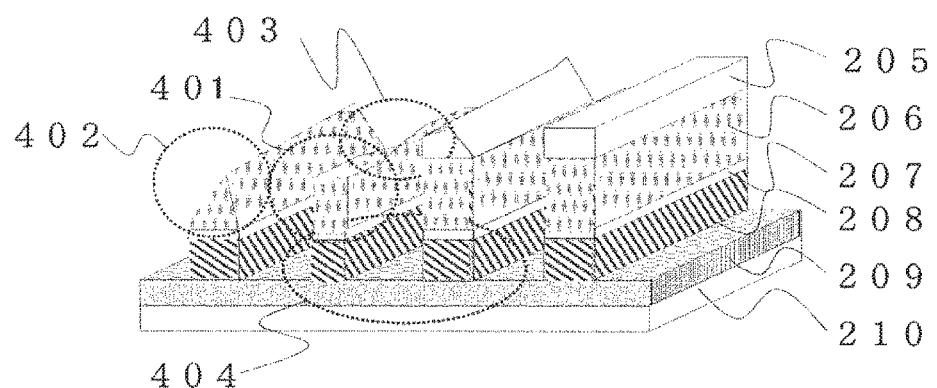
FIG. 4A shows a perspective view of the result of forming a gate electrode of the polymetal gate structure shown in FIG. 2A by a conventional plasma etching method.
Figure 4B:
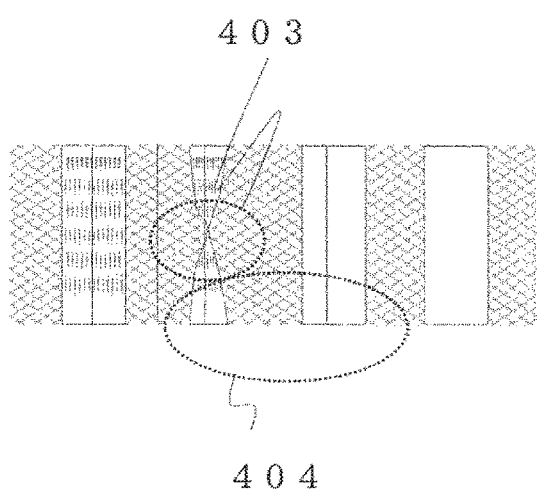
FIG. 4B shows a plan view of the result of forming a gate electrode of the polymetal gate structure shown in FIG. 2A by a conventional plasma etching method.

By way of comparison, a perspective view of a result obtained by etching the gate electrode having a polymetal gate structure as shown in FIG. 2C using a mixed gas of $Cl_2$ gas, $NF_3$ gas and $SiCl_4$ gas disclosed in Patent Literature 1 is shown in FIG. 4A. FIG. 4B is a plan view of the pattern of FIG. 4A as viewed from above. The strong reactivity of the silicon nitride film 205 which is a hard mask with $NF_3$ gas causes shape tapering 402 due to the reduction in a gate electrode processing dimension 401 and the reduction of a mask selection ratio, which causes a decrease in a yield due to disconnection 403 of the pattern and variation 404 in a processing dimension.

Figure 5:
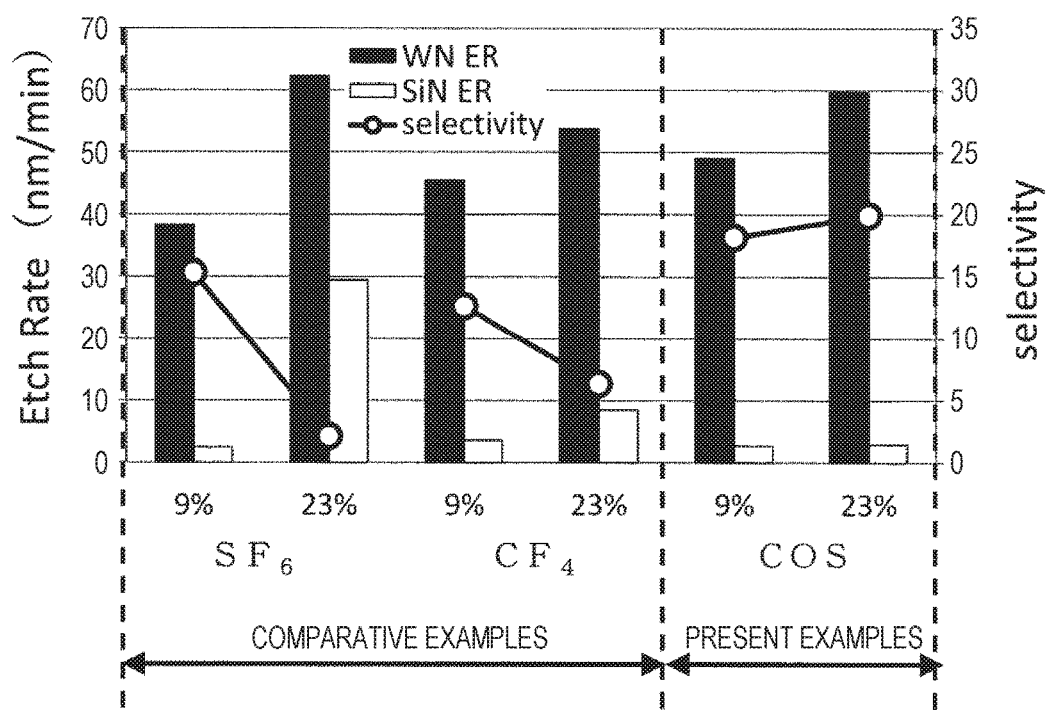
FIG. 5 shows the results of comparing the etching rates and selection ratios of tungsten nitride (WN) and silicon nitride (SiN) films in Examples and Comparative Examples.

Next, FIG. 5 shows the results of comparing the etching rate and selection ratio of each of tungsten nitride (WN) and silicon nitride film (SiN) in the present Example and Comparative Example. Note that the selection ratio here is the etching rate ratio of the tungsten nitride film (WN) to the etching rate of the silicon nitride film (SiN). As result of the present Example, 9% or 23% of COS gas is added to a mixed gas of $Cl_2$ gas, $O_2$ gas, and $SiCl_4$ gas. As results of Comparative Examples, 9% and 23% of $SF_6$ gas as a fluorine-based gas or 9% and 23% of $CF_4$ gas are mixed with a mixed gas of $Cl_2$ gas, $O_2$ gas and $SiCl_4$ gas. For other etching conditions, processing pressure is 0.6 Pa; microwave power is 600 W; wafer bias power is 20 W; and a stage temperature is 50° C.

When the addition amount of $SF_6$ gas or $CF_4$ gas of Comparative Examples is changed from 9% to 23%, the etching rate of silicon nitride is also increased as with tungsten nitride, and the selection ratio of tungsten nitride to silicon nitride is decreased from 15.3 to 2.1 in the case of $SF_6$ gas, and decreased from 12.6 to 6.3 in the case of $CF_4$ gas. On the other hand, when the addition amount of COS gas in the present Example is changed from 9% to 23%, the etching rate of silicon nitride is not changed, and the selection ratio of tungsten nitride to silicon nitride is increased from 18.2 to 19.9.

Figure 6:
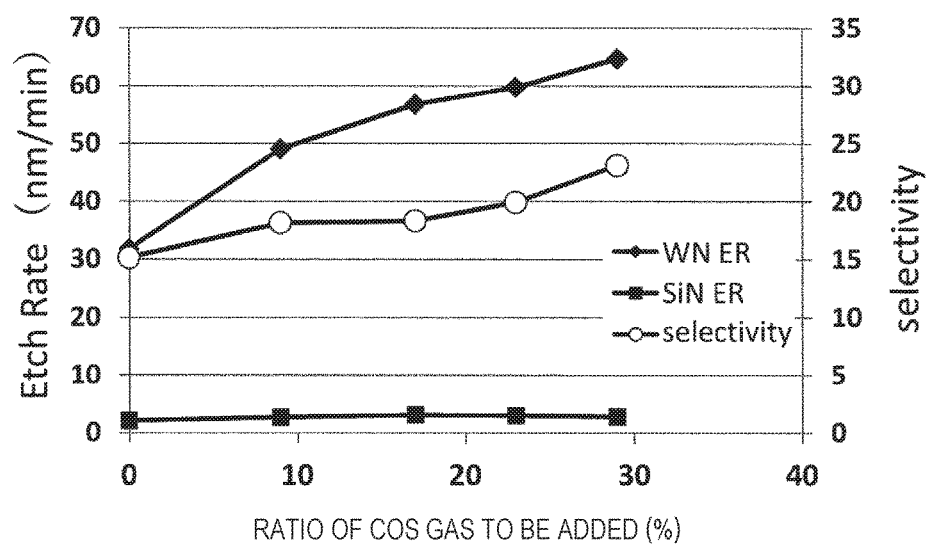
FIG. 6 shows the etching rates of tungsten nitride (WN) and silicon nitride (SiN) and the dependence of the addition amount of COS gas with respect to the selection ratio of tungsten nitride (WN)

FIG. 6 shows the dependence of the addition amount of COS gas with respect to the etching rates of tungsten nitride (WN) and silicon nitride (SiN) and the selection ratio of tungsten nitride (WN). The addition amounts of COS gas are set to 0%, 9%, 17%, 23%, and 29%. As shown in FIG. 6, the rate of tungsten nitride (WN) with respect to the addition amount of COS gas is monotonically increased, and the selection ratio is increased from about 15 to about 23.

However, when the gate electrode having a polymetal gate structure as shown in FIG. 2C is etched with the addition amount of COS gas being 29%, deposits adhere to the vicinity of the mask of the silicon nitride film (SiN) 205, an abnormal shape occurs in a pattern in which the opening area of a material to be etched is small. Therefore, it is desirable to add COS gas in an amount of 9 to 23%.

Figure 7:
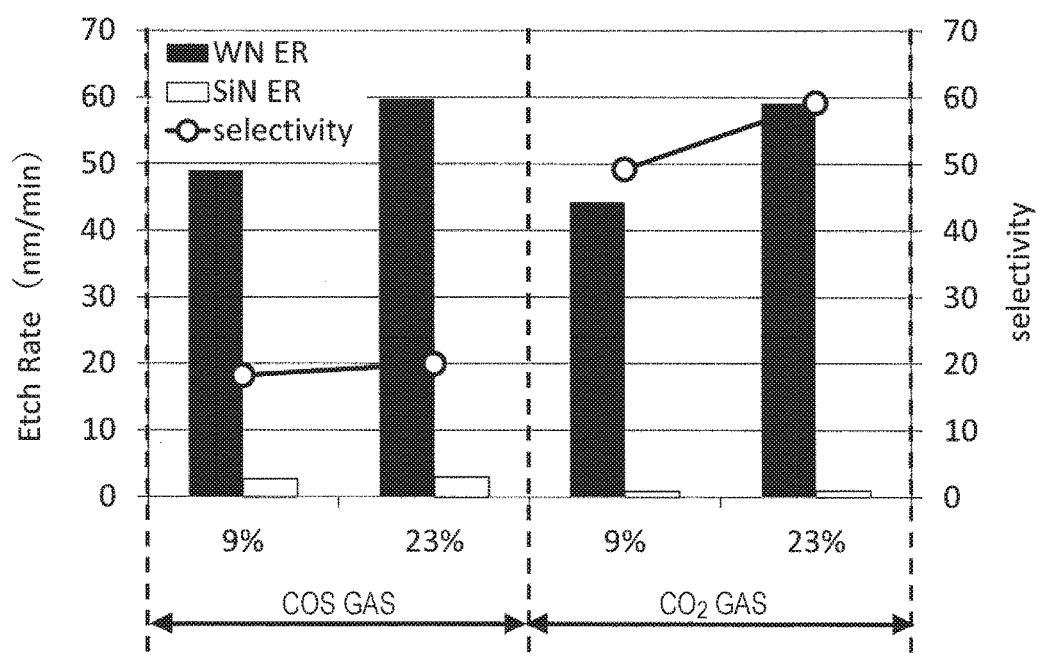
FIG. 7 shows the results of comparing the characteristics of COS gas and $CO_2$ gas with respect to the etching rates and selection ratios of tungsten nitride and silicon nitride.

FIG. 7 shows the results obtained by respectively obtaining the etching rate and selection ratio of tungsten nitride and silicon nitride when 9% or 23% of COS gas is added to a mixed gas of $Cl_2$ gas, $O_2$ gas, and $SiCl_4$ gas, and when 9% or 23% of $CO_2$ gas is added to mixed gas of $Cl_2$ gas, $O_2$ gas, and $SiCl_4$ gas, and comparing the characteristics of COS gas and $CO_2$ gas.

In the case of $CO_2$ gas, the rate of silicon nitride is as low as about 1 nm/min with respect to about 3 nm/min of COS gas, so that the selection ratio is as high as 49.2 even when the addition amount is 9%. In the case of 23% of $CO_2$ gas, the selection ratio is further increased to 59.1. This result shows that a tungsten nitride (WN) film having a higher selection ratio than that of the silicon nitride (SiN) film can be etched by adding a gas containing a carbon element and an oxygen element to a mixed gas of $Cl_2$ gas, $O_2$ gas and $SiCl_4$ gas. That is, even if a gas containing a carbon element such as CO gas and an oxygen element other than $CO_2$ gas and COS gas is added to the mixed gas of $Cl_2$ gas, $O_2$ gas, and $SiCl_4$ gas, the same effect as that of the present Example can be obtained by appropriately adjusting the addition amount, the processing pressure, and the wafer bias or the like.

As described above, according to the present Example, in etching for forming a gate electrode having a polymetal gate structure including a tungsten (W) film and a tungsten nitride (WN) film in a miniaturized pattern, the etching of a tungsten nitride (WN) film with a higher selection ratio and a higher throughput than those of a silicon nitride film can be achieved, and the disconnection of the pattern and variation in a processing dimension can be reduced, which can provide an improvement in a yield.

In the present Example, an example using a mixed gas of $Cl_2$ gas, $O_2$ gas, $SiCl_4$ gas, and a gas containing a carbon element and an oxygen element has been described. However, since an oxygen element of a gas containing a carbon element and an oxygen element also serves as $O_2$ gas, the $O_2$ gas is not necessarily required. In other words, even if a mixed gas of $Cl_2$ gas, $SiCl_4$ gas, and a gas containing a carbon element and an oxygen element is used, the same effect as that of the present Example can be obtained.

Furthermore, in the present Example, the etching example of the tungsten nitride film (WN) is used, but the same effect as that in the present Example can be obtained when the tungsten film (W) is etched. That is, the plasma etching of the present invention can be applied to the etching of a film containing a tungsten element.

In the present Example, the use of a mixed gas of $Cl_2$ gas, $O_2$ gas, $SiCl_4$ gas, and a gas containing a carbon element and an oxygen element as an example has been described. However, the same effect as that of the present Example can be obtained by using a gas containing a halogen element such as $BCl_3$ Gas, HBr gas, or HI gas as the $Cl_2$ gas of the mixed gas. Furthermore, in the present Example, an example using a mixed gas of $Cl_2$ gas, $O_2$ gas, $SiCl_4$ gas, and a gas containing a carbon element and an oxygen element has been described. However, the same effect as that of the present Example can be obtained by using a gas containing a silicon element such as $SiF_4$ gas as the $SiCl_4$ gas of the mixed gas.

As described above, according to the plasma etching method of the present invention, in etching for a miniaturized film containing a tungsten element, a film containing a tungsten element can be etched with a higher selection ratio and a higher throughput than those of the silicon nitride film, and the disconnection of the pattern and variation in a processing dimension can be reduced, which can provide an improvement in a yield.

When the present invention is applied, the same effect as that of the present Example can be obtained by appropriately adjusting a circuit pattern formed on the wafer 106 (for example, a line & space represented by a gate electrode, a contact hole, or the like) or a film structure (for example, silicon nitride is a mask or a base film), the selection and addition amount of gas species containing a carbon element and an oxygen element according to not only ECR but also ICP (Inductively Coupled Plasma), CCP (Capacitive Coupled Plasma), and other plasma source using helicon wave or p wave, the processing pressure, and the wafer bias or the like.

What is claimed is:

1. A plasma etching method for etching a film containing a tungsten element using plasma, the method comprising:
   etching the film containing a tungsten element by plasma generated using a gas containing a silicon element, a gas containing a halogen element, and a gas containing a carbon element and an oxygen element,
   wherein the gas containing a carbon element and an oxygen element is COS gas, CClO gas, $C_2H_4O$ gas, $C_3F_5O$ gas, $CH_3OH$ gas, $COF_2$ gas, or HCHO gas.

2. The plasma etching method according to claim 1, wherein the gas containing a carbon element and an oxygen element is COS gas.

3. The plasma etching method according to claim 1, wherein
   the gas containing a halogen element is $Cl_2$ gas, $BCl_3$ gas, HBr gas, or HI gas, and
   the gas containing a silicon element is $SiF_4$ gas or $SiCl_4$ gas.

4. A plasma etching method for etching a film containing a tungsten element using plasma, the method comprising:
   etching the film containing a tungsten element by using a mixed gas of $Cl_2$ gas, $SiCl_4$ gas, oxygen gas, and COS gas.

5. The plasma etching method according to claim 4, wherein the film containing the tungsten element is a tungsten nitride (WN) film.

6. A plasma etching method for etching a tungsten nitride (WN) film using plasma, the method comprising:
   etching the tungsten nitride (WN) film by plasma generated using a gas containing a silicon element, a gas containing a halogen element, and a gas containing a carbon element and an oxygen element.

* * * * *